United States Patent [19]

Hart et al.

[11] 4,376,584
[45] Mar. 15, 1983

[54] PATTERN PRINTING INCLUDING ALIGNING MASKS AND MONITORING SUCH ALIGNMENT

[75] Inventors: Robert J. Hart, Lee's Summit, Mo.; Ralph C. Joseph, Allentown, Pa.

[73] Assignee: Bell Telephone Laboratories, Inc., Murray Hill, N.J.

[21] Appl. No.: 155,030

[22] Filed: Jun. 2, 1980

[51] Int. Cl.³ .............................................. G01B 11/00
[52] U.S. Cl. .................................. 356/401; 356/394; 356/243
[58] Field of Search ............... 356/392, 393, 394, 397, 356/399, 400, 401, 243; 358/101, 106

[56] References Cited

U.S. PATENT DOCUMENTS

| | | | |
|---|---|---|---|
| 3,207,904 | 9/1965 | Heinz | 250/202 |
| 3,560,093 | 2/1971 | Montone | 356/393 |
| 3,567,853 | 3/1971 | Green | |
| 3,581,375 | 6/1971 | Rottmann | 29/407 |
| 3,603,728 | 9/1971 | Arimura | |
| 3,749,830 | 7/1973 | Blitchington | 250/222 |
| 3,899,634 | 8/1975 | Montone | |
| 3,903,363 | 9/1975 | Montone et al. | 358/101 |
| 3,988,535 | 10/1976 | Hickman et al. | |

*Primary Examiner*—R. A. Rosenberger
*Attorney, Agent, or Firm*—W. O. Schellin

[57] ABSTRACT

A circuit pattern printing system includes alignment apparatus (71) which is located remote from a printer (35). The alignment apparatus includes a means for displaying a cursor (69) on a video screen (101). The cursor identifies a desired position of a fiducial mark (61) printed on a substrate (106) when the substrate is positioned against a reference guide (86) on an alignment table (76). The cursor (69) and the reference guide (86) are aligned to each other by first aligning the reference guide (86) to an alignment marker on a standards substrate (41), and then aligning the cursor to a fiducial mark located on the same standards substrate.

3 Claims, 12 Drawing Figures

4,376,584

PATTERN PRINTING INCLUDING ALIGNING MASKS AND MONITORING SUCH ALIGNMENT

TECHNICAL FIELD

This invention relates to methods of and apparatus for printing a pattern, such as a circuit pattern, on a substrate. The invention relates particularly to such printing methods and apparatus wherein a precise alignment of a mask with respect to a substrate is desirable.

BACKGROUND OF THE INVENTION

Because of a continued trend to reduce the size of electronic circuits, thick film circuits are being used more frequently in many commercial products. Ceramic thick film circuit substrates often take the place of traditional printed wiring boards. The thick film substrates are smaller and also more refined and dimensionally more stable than the traditional printed wiring boards. Consequently, semiconductor chips may be mounted directly onto the substrates rather than through more space consuming "Dual Inline Packages" (DIPs).

Thick film circuits also have been chosen as alternates to thin film circuits. However, while thick film circuits may be manufactured at a lower cost than thin film circuits, the thick film circuits are typically also less precise than their thin film counterparts. The greater precision of thin film circuits results from the photolithographic processes by which thin film patterns are generated.

Thick film circuits, on the other hand, are generated by repeatedly screening pastes through patterned masks onto a substrate. After each screening operation the screened-on paste pattern is fired to harden it and to thereby transform it into a permanent feature of the substrate. Each level of such screened and fired patterns typically differs from its adjacent levels in the physical layout of the pattern and in the electrical characteristics of the applied paste. Various pastes produce different patterned features on the substrate, which include conductors, resistors of various resistivities, and insulators.

Masks for the various pattern levels have to be aligned with respect to each other to produce the desired circuits. Misalignment between different mask levels may occur because of nonuniform wear of reference guides, which is typically caused by extreme abrasive characteristics of the typical ceramic material of the substrates. Also, after an initial alignment of the masks, it is possible for the masks to creep out of an initial optimum alignment position because of stresses to which the masks are subjected during repeated screen printed operations. In contrast to the screen printing masks, photolithography masks used in thin film production processes are not subject to such stresses.

According to known thick film forming techniques, a first level mask generates a plurality of sets of alignment fiducial marks. Each subsequent level mask includes in its printing pattern a uniquely positioned feature which matches and corresponds in its optimum alignment position to a corresponding fiducial mark printed on the substrate through the first level mask. The masks of such subsequent levels become aligned with respect to each other through the fiducial marks printed through the first level mask.

Inaccuracies in the boundaries of the screened ink patterns in each of two patterns which are referenced against each other in each alignment tend to decrease the precision of the thick film circuits. In addition, there exists an inherent problem of aligning the first level mask to the nominal edge of the substrates. It has been found that a majority of the substrates have edges which deviate from an ideal true edge position. However, it is particularly desirable to adjust the overall printed pattern to the mean or true edge of all the substrates. Such an adjustment limits a maximum error displacement of the pattern from an edge to an error no greater than half the distance between two worst case error displacements in opposite directions.

SUMMARY OF THE INVENTION

Accordingly, the invention contemplates new and improved methods of and apparatus for forming a pattern on a substrate. The substrate is positioned relative to a first reference guide mounted on a printing apparatus. A mask, which is also mounted on the printing apparatus, is brought into contact with the substrate in a position relative to the first reference guide. Such a position is determined by minimizing a deviation of an image of a printed fiducial mark on a test substrate from the position of an alignment cursor on a screen. The alignment cursor indicates a predetermined position from a second reference guide located remote from the printing apparatus. The pattern which includes a fiducial mark is formed on the substrate in the position determined by the contacting mask.

In another embodiment of the invention, a standards substance includes a flat surface and means for positioning such surface relative to a reference guide. The substrate displays on such surface at least one fiducial mark which is precisely positioned relative to the positioning means, and a gauge for adjusting the size of a cursor. The fiducial mark includes optically discernible markers for delineating a space of predetermined size in two orthogonal directions, such size having a predetermined relationship to the gauge for adjusting the size of the cursor.

BRIEF DESCRIPTION OF THE DRAWING

Various advantages and features of the invention may be best understood by reading the following detailed description in conjunction with the appended drawing, wherein.

DETAILED DESCRIPTION

1. A Prior Art Alignment System

Figure 1:
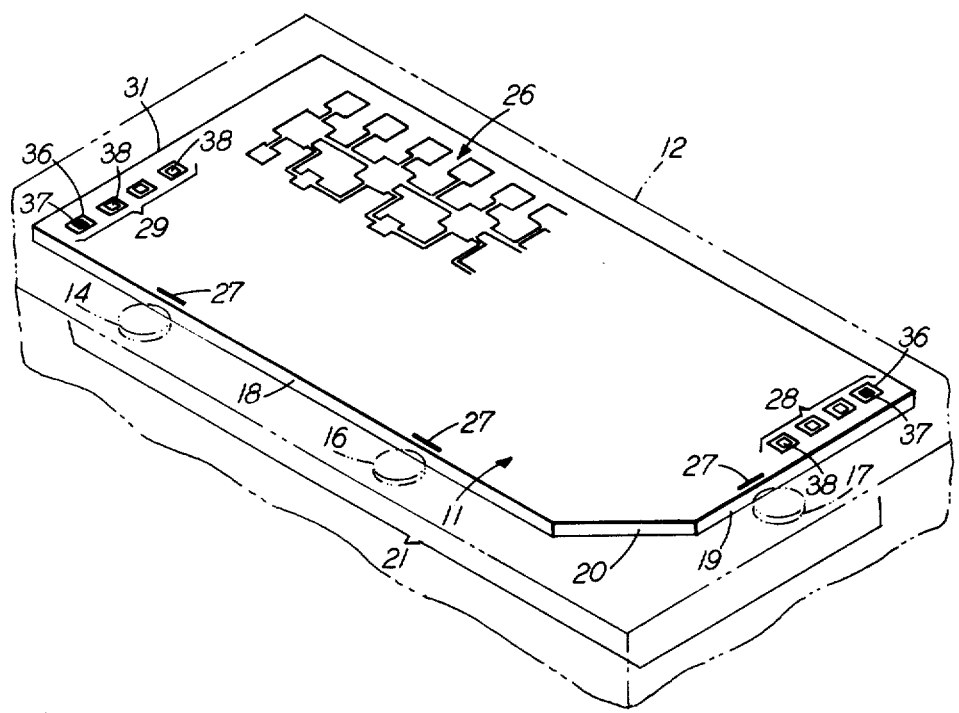
FIG. 1 is a pictorial view of a prior art substrate which is positioned against typical alignment discs.

FIG. 1 shows a typical thick film substrate which is designated generally by the numeral 11. The substrate is supported on a typical table or platform 12 and held in position by three discs 14, 16 and 17. The discs 14 and 16 are contacted by a base edge 18 of the substrate 11, thereby determining or referencing the vertical or "y" position of the substrate 11, as well as its theta or angular orientation in the plane of the platform 12. The disc 17 is contacted by a vertical edge 19 of the substrate 11 thereby establishing a fixed position of the substrate 11 in the horizontal or "x" direction. An angular edge 20 identifies the intersection of the edges 18 and 19 to facilitate a correct orientation of the substrate 11 relative to the discs.

The discs 14, 16 and 17 in combination represent a preferred reference guide 21 for establishing a precise position of a substrate, such as the substrate 11, relative to the platform 12. The three-disc reference guide 21 is a preferred guide means which is also used in conjunction with the present invention. However, other guide means, as for example typical tapered locating pins could be used, and, as will be seen from the description below, the invention is not based on the use of any particular type of reference guide.

The substrate 11 shown in FIG. 1 is a typical prior art substrate, as it may be recognized from printed fiducial marks for aligning various levels of a printed pattern 26. Such marks, for instance, include typical pattern-to-edge locator marks 27 for locating and orienting subsequent printed levels in reference to the edges of the substrate 11.

The locator marks 27 are printed on the substrate 11 by the same first mask (not shown) which also prints two groups of apertured squares 28, 29 along, for instance, the edge 19 and an opposite edge 31. A measurement is made on an initial printed of the locator marks 27 on the substrate to determine whether the distance from the outer edge of each mark to its respective edge 18 or 19 is within a predetermined tolerance, typically about 0.25 mm of a nominal value.

Upon a proper alignment of the first mask in a printer 35 (see FIG. 4), as determined by such measurement from the mark 27 to the respective edge of the substrate 11, the apertured squares are used in further printing operations to verify a mutual alignment of various levels of the pattern 26.

Just as with any other print level for forming the pattern 26 the printed features of the first level are fired to make the printed apertured squares into permanent features of the substrate. A selected square 28 and a selected square 29 from the opposite edge of the substrate serve as fiducial mark 36 for aligning the mask of one of the subsequently printed levels of the pattern 26. Such a mask is shifted with respect to the printed 35 until square dots 37 printed as portions of the particular mask level are matched in their position to the apertures 38 in the apertured squares. When the dots 37 are positioned in the respective apertures 38 the mask is aligned with respect to the substrate in the horizontal and the vertical directions as well as in its planar orientation.

A problem with the above-described mask alignment is recognizing a deviation of the dots 37 from a nominal position. There is at least some run-out in the ink of the fiducial mark 36 as well as in the printed dots 37. At times a slight overlap of the dots 37 over the apertured squares is not recognized as a misalignment of a respective mask until a gap appears between the printed dots 37 and the respective fiducial mark 36. Even then, the precise degree of misalignment of the mask is not readily determined to affect a proper adjustment of the position of the mask relative to the printed 35.

2. A Standards Substrate

Figure 2:
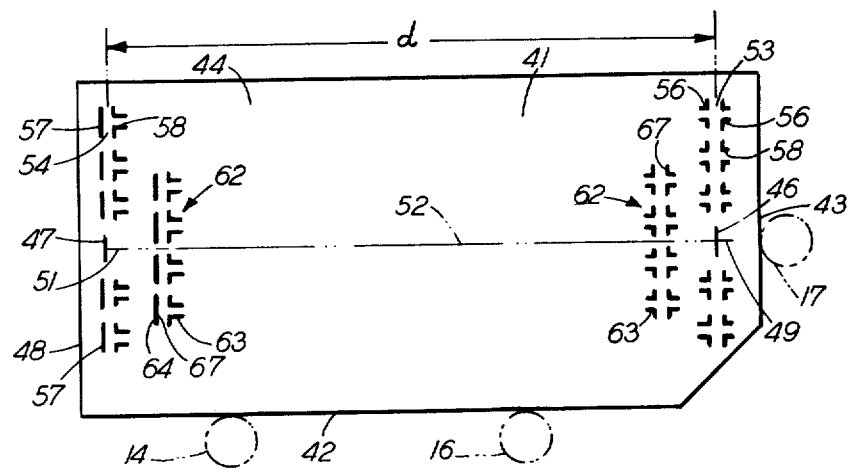
FIG. 2 shows a standards substrate as one embodiment of the present invention located against alignment discs similar to those shown in FIG. 1.

Referring now to FIG. 2, there is shown a standards substrate 41 in accordance with the present invention. Two orthogonal edges 42 and 43 of the substrate 41 serve as horizontal and vertical reference edges, respectively. The reference edges may be precision ground to obtain an exceptionally high degree of precision. On a flat, major surface 44 of the substrate 41 various groups of optically discernible indicators are located. The previously described prior art reference guide 21 is preferred for positioning substrates which are to be printed in accordance with this invention. It has been found desirable for achieving best alignment results, however, to use the same type of reference guide in all of the printers and alignment apparatus, which are used informing the various levels of one particular pattern.

In accordance with the preferred choice, the horizontal edge 42 of the substrate 41 is positioned against the typical discs 14 and 16. The discs 14 and 16 establish the vertical reference position and the rotational or theta reference position of the reference substrate 41, or of any other substrate which may be placed against such discs. The vertical reference edge 43 of the substrate is positioned against the disc 17 which similarly establishes the horizontal reference position of the substrate 41.

Of the various groups of indicators on the substrate 41, a complementary pair of hairline alignment markers 46 and 47 vary in appearance from other indicators. The first hairline marker 46 is in a preferred form of a cross, and is located adjacent to the vertical edge 43. The second hairline marker 47 is in the preferred form of a reoriented letter T, and is located adjacent to the opposite vertical edge 48. The indicators are instrumental in the theta alignment of the substrate 41, and hence, in the alignment of the respective reference guide 21. The hairline markers 46 and 47 include characteristic horizontal line segments 49 and 51, respectively. The line segments 49 and 51 are mutually collinear and establish a reference axis 52 on the substrate 41 which is parallel to the horizontal edge 42.

Also located along the vertical edges 43 and 48 and spaced from each other by the distance "d" are a plurality of areas or regions 53 and 54, respectively. The regions 53 and 54 are bounded and defined by boldly discernible markers 56, 57 having at least one straight edge 58 which is disposed either parallel to or perpendicular to the horizontal edge 42. The markers 56, 57 are disposed about the selected regions 53, 54 such that the edges 58 of two mutually opposite markers 56 or 57 are parallel and adjacent to each other. A space between such opposite markers 56 or 57 is formed to a precise preselected dimension so that the regions 56 or 57 may serve as reference areas.

Figure 4:
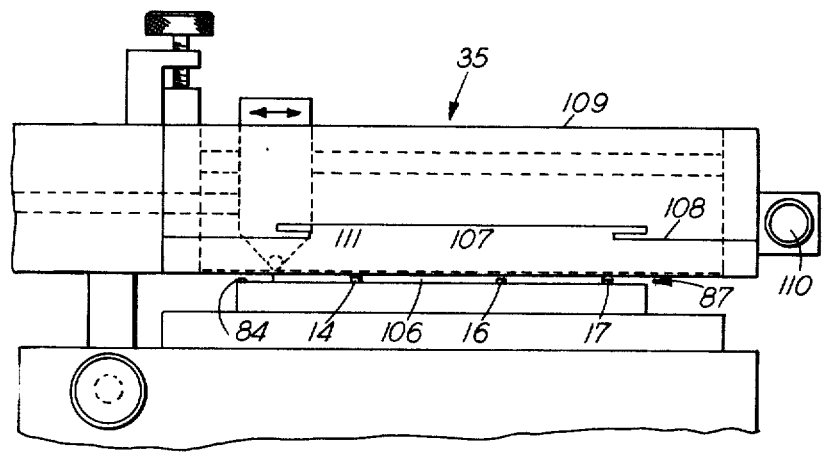
FIG. 4 is a simplified section through a typical screen printer used for forming patterns on substrates.

A preselected region 53 and a corresponding region 54 adjacent the opposite edge 48 and on the same horizontal reference line as the region 53 are complementary to form a fiducial mark 61 for a particular mask (such as shown in the printer 35 in FIG. 4). Such a mask has in addition to desired circuit pattern features feature openings which correspond precisely in size and shape as well as in position to the position of the markers 56 or 57 which have been selected as the fiducial mark 61 for the particular mask. The positions of the fiducial mark and the openings in the mask correspond to each other when the mask pattern is in a desired position relative to the edges 42 and 43 of the standards substrate 41.

Each one of a set of masks which may be required to form a particular circuit pattern is assigned a distinct fiducial mark comprising one of the complementary, horizontally opposite sets of the regions 53 and 54 as defined by the respective markers 56 and 57. To help in the selection of the correct fiducial mark for any particular mask in the order of printing each set of the markers 56 and 57 which delineate the fiducial mark 61 are on the standards substrate 41 according to the mask level associated with the particular fiducial mark 61.

Another group of markers on the substrate 41 are cursor standards 62. The cursor standards 62 are optically discernible markers 63 and 64 substantially of the same shape as the markers 56 and 57. Furthermore, the arrangement of the markers 63 and 64 is similar to that of the markers 56 and 57. A distinction of the cursor standards 62 over the fiducial marks lies in the spacing of mutually facing straight edges 67 of the opposing markers 63 or 64. Each one of the standards 62 has a spacing different from that of any other of the standards 62. Such spacing of regions 68 between such parallel edges 67 is used to establish a predetermined standard for the width of a cursor 69 (see FIG. 3). Such functions as establishing the width of the cursor 69 and positioning the cursor relative to a preselected fiducial mark may be best understood in relationship to a description of an exemplary alignment apparatus 71 which is illustrated in FIG. 3.

3. An Alignment Apparatus

Figure 3:
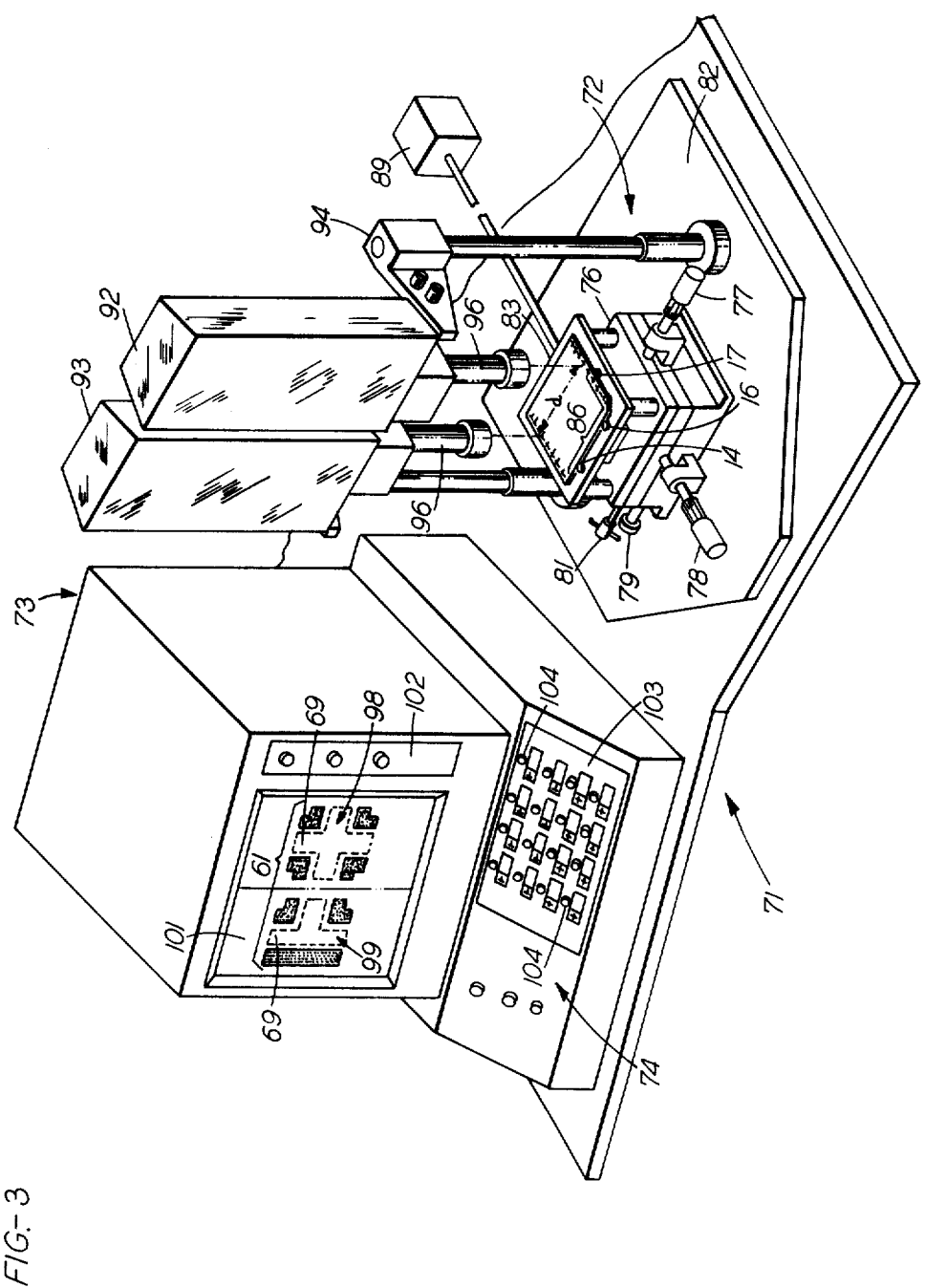
FIG. 3 is a partly schematic drawing of a video camera-and-screen alignment apparatus incorporating features of the present invention.

FIG. 3 is a somewhat simplified and partly schematic representation of a typical alignment apparatus 71 which may be operated in accordance with the present invention. The apparatus 71 includes a precision manipulating apparatus 72 for aligning an article separately in two orthogonal directions of a plane and for orienting such article in such plane. A split optics viewing system 73 of the apparatus 71 monitors the position of such article as it is aligned by the apparatus 72. In the preferred embodiment the viewing system 73 is a dual-camera and split screen video system which includes an apparatus 74 for generating a cursor of preselected dimension for marking the locations of certain observed dimensions.

A preferred embodiment of the alignment apparatus 71 utilizes a typical micro positioner or X-Y-(theta) alignment table 76 as it is for example available from Line Tool Company, Allentown, PA. The table 76 includes micrometer controls 77 and 78 for the horizontal and vertical adjustments, respectively, and a rotational orientation adjustment 79 which may be locked by a separate locking screw 81.

The alignment table 76 is mounted on a base 82 of the alignment apparatus 71. A support platform 83 is exchangeably mounted to the table 76. The typical three discs 14, 16 and 17 are mounted to the platform 83 in mutually interrelated positions which correspond to the mutually interrelated positions of identical discs 14, 16 and 17 mounted on a similar support platform 84 of the printer 35 shown in FIG. 4. The discs 14, 16 and 17 consequently represent a second reference guide 86 identical to the reference guide 87 in the printer 35, except that the reference guide 86 is located remote from the printer 35 on the alignment apparatus 71.

The platform on the alignment apparatus 71 is equipped with a typical vacuum retention system coupled to a typical vacuum supply 89. Thus, when the standards substrate 41 or any other substrate has been placed into contact with the second reference guide 86 the vacuum is activated in a usual manner to retain such substrate in the desired position with respect to the discs 14, 16 and 17.

The split optics system 73 of the apparatus 71 may be chosen from any number of commercially available systems. The invention is described with respect to an electronic video dual-camera and split-screen display system, such as one which is commercially available under the trade name Video/Gauge from Stocker and Yale, Beverly, MA. Two cameras 92 and 93 are mounted through suitable supports 94 above the platform 83 to focus on the platform. Preferably the mounting supports 94 provide for a lateral adjustment of the cameras 92 and 93 to space the optics of the cameras by the predetermined distance "d". Thus when the standards substrate 41 is mounted on the platform and the position of the substrate 41 is adjusted to the objective lenses 96 of the cameras 92 and 93 the field of view of the respective cameras will be substantially centered on the markers of the fiducial marks 61.

The described dual-camera, split-screen viewing system 73 operates in conjunction with the cursor generator 74 which provides for an electronic generation of highlighted areas 98 and 99 on a viewing screen 101 of a video set 102. A typical control panel 103 may provide various adjustment controls 104 for selecting horizontal and vertical dimensions of the areas representing various portions of the cursors 98 and 99 and for independently moving each of such areas across the screen 101.

In the presently described cursor generator system 74 each area 98 or 99 is comprised of two independently adjustable and movable portions, typically a horizontal and a vertical one.

As an adjustment of the controls 77 and 78 moves both regions 53 and 54 of a selected fiducial mark 61 into an adjacent position on the screen 101, the cursor areas 98 and 99 of predetermined size and shape may be moved across the screen into superposition with such regions. The position of such areas 98 and 99 referred to as the cursor 69 later identifies and marks the precise position of the regions 53 and 54 even after the substrate bearing the fiducial mark 61 has been removed from the platform 83.

4. A Printer

FIG. 4 shows a simplified view of the printer 35 as a typical example of any number of commercially available thick film circuit printers. On the platform 84 a substrate 106 is positioned for printing and held there against the discs 14, 15 and 17 through the application of a typical vacuum. A selected mask 107 is mounted in a frame 108. The position of the frame 108 is adjustably mounted in an upper structure 109 of the printer 35. Typical micrometer controls permit a measured shift of the frame 108 to align the mask 107 in a precise position opposite to the substrate 106. The mask 107 is then typically contacted against the substrate 106 and a movably mounted blade 111 urges a desirable quantity of a preselected ink through openings in the mask 107 to form the desired pattern on the substrate 106. Of particular interest in the operation of the printer 35 is the manner in which the mask is adjusted. The following process uses the previously described standards substrate 41 and the alignment apparatus 71 to position the mask 107 relative to the platform 84 and to any substrate thereon. Such a process also permits continuously monitoring the alignment of the mask 106 with respect to such substrate.

Figure 11:
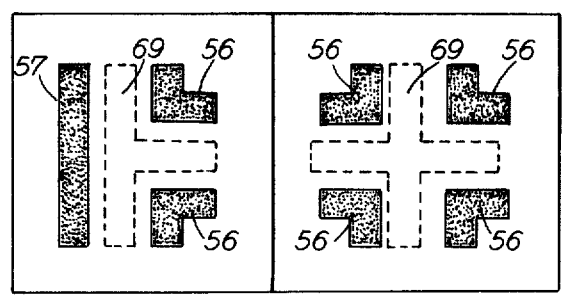
FIG. 11 shows a printed fiducial mark having an alignment error because of an apparent strain in the mask.
Figure 12:
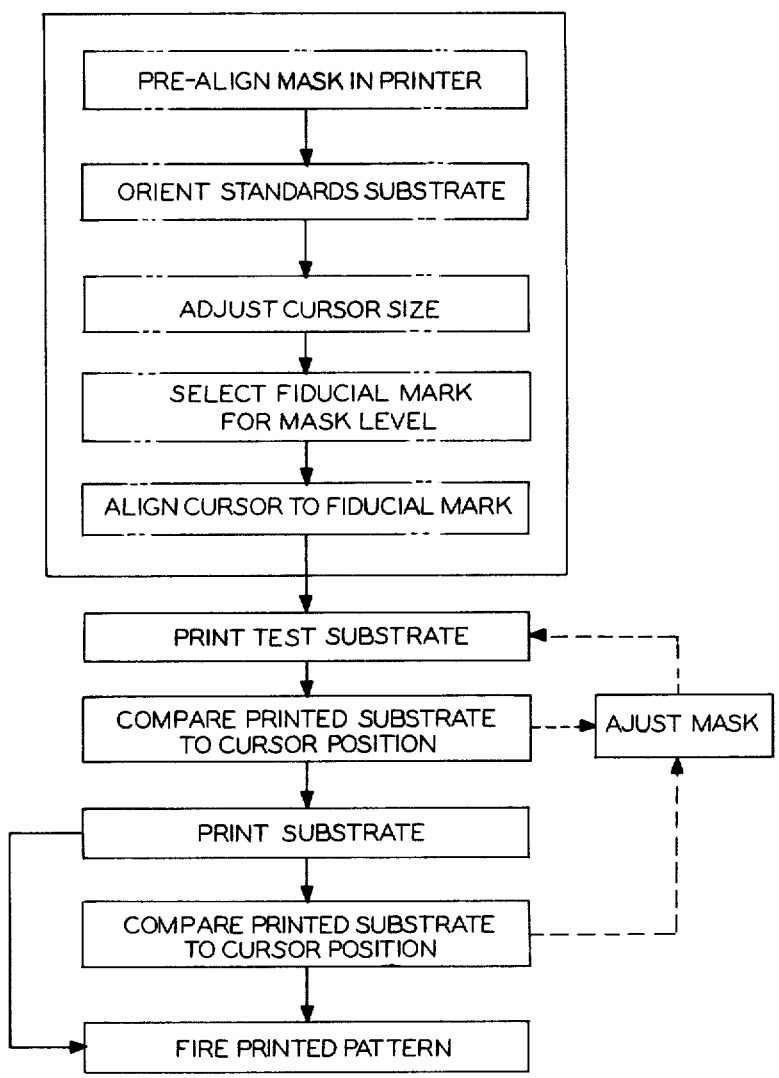
FIG. 12 is a flow chart of an alignment process according to the present invention.

5. A Printing Process Including Aligning the Mask and Monitoring Such Alignment A preferred printing process which is outlined in the diagram of FIG. 12 is best described with additional reference to FIGS. 5 through 11. Typical micrometer adjustments of the frame 108 allow a preliminary adjustment of the mask 107 with respect to the reference guide 87 in the printer 35. The substrate 106 which is positioned against the guide 87 for printing during the alignment of the mask 107 is referred to as a test substrate. A test pattern printed on such test substrate 106 during the alignment of the mask 107 is typically removed from the substrate rather than dried or fired to become part of the substrate.

Independently of such preliminary alignment of the mask 107 within the printer 35, the standards substrate 41 is placed into contact with the second reference guide 86 as shown in FIG. 3. The horizontal and vertical controls 77 and 78 are manipulated to display the "cross" and "T" markers 46 and 47 on the screen 101. A theoretical axis extending through the centers of the field of view of the two cameras 92 and 93 becomes a horizontal reference axis of the video screen 101. Even though such axis is not identified through any particular line, the horizontal line segments 49 and 51 of the markers 46 and 47 are easily adjusted to such horizontal reference axis by aligning the segments 49 and 51 to each other. Any angular deviation of the reference axis 52 on the substrate from the reference axis of the screen 101 is easily recognized by a misalignment of the line segments 49 and 51, when the markers 46 and 47 are displayed with a preferred 55X magnification on the screen 101.

Figure 5:
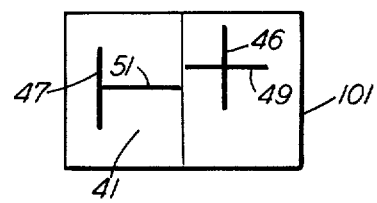
FIGS. 5 and 6 show images of alignment markers during the theta alignment of the standards substrate.

A typical angular misorientation of the reference axis 52 and, hence, the substrate 41 with respect to the horizontal reference axis is shown in FIG. 5. The horizontal line segments 49 and 51 are clearly misaligned with respect to each other as they appear on the screen 101. A manipulation of the rotational or theta control 79 on the alignment table 76 readily brings the line segments 49 and 51 into collinear relationship with each other and hence into orientational alignment with the horizontal reference axis of the screen 101. Such an alignment is shown in FIG. 6.

Figure 6:
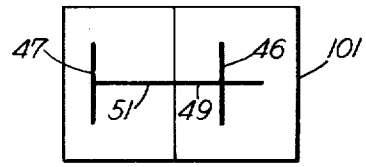
Figure 7:
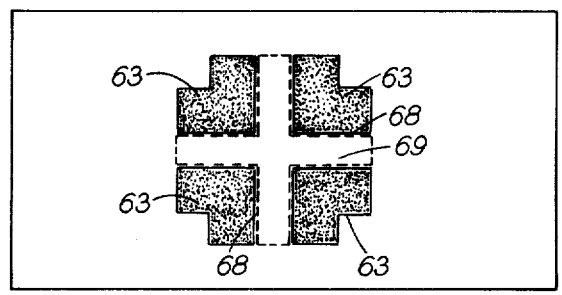
FIG. 7 is a typical standard for adjusting the width of the cursor.

FIGS. 5 and 6 also show advantages of the split image optics used in conjunction with the screen 101. Major intervening areas of the substrate 41 are eliminated as the significant markers 46 and 47 near opposite edges of the substrate 41 are enlarged sufficiently for a clear alignment of the substrate 41 to the reference axis. After the reference axis 52 is aligned to the horizontal axis of the screen 101, the locking screw 81 is tightened to retain the orientation of the second reference guide relative to the screen 101.

The cursors 69 are now generated on the screen 101 and adjusted to a desired size. Such an adjustment is best described in relationship to FIG. 7. Manipulation of the horizontal and vertical micrometer controls 77 and 78 on the alignment table 76 shifts a desired one of the cursor standards 62 of the substrate 41 into view of one of the cameras 92 or 93. It should be noted that the standards for the "cross" on the right hand side of the substrate 41 and the corresponding "T" standard are spaced at a distance less than the distance "d" of the cameras, and only one of the standards 62 can be brought into view on the screen 101 at one time. A numeral is displayed above each of the standards 62 to indicate the tolerance in any selected dimensional system, such as in microns ($10^{-6}$ meters). Operating the respective controls 104 on the panel 103, the length and the width of the cursors 69 is manipulated to occupy the regions 68 between the markers 63. These regions 68 are not as wide as the regions 53 or 54 of the respective fiducial mark 61, so that a small gap 116 (see FIG. 9) which exists when the cursor 69 is aligned with the fiducial mark 61 represents the tolerance or maximum permissible deviation any mask 107 is allowed to have from the standard of the substrate 41. After the "cross" standard 62 is adjusted, the horizontal micrometer control 77 is turned to bring the complementary "T" standard 62 into view, and the second portion of the cursor 69 is adjusted.

Figure 9:
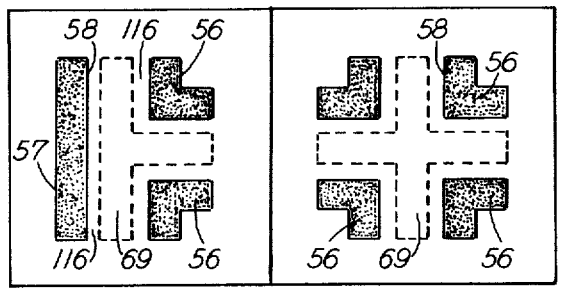

The view of the substrate 41 on the screen 101 is now shifted to move the markers 63 and 64 out of alignment by again manipulating the horizontal control 77 and the vertical control 78 until a selected fiducial mark 61 is brought into alignment with the field of view of the cameras 92 and 93, as shown in FIG. 9. Each half of the selected fiducial mark 61 is centered in its respective portion of the split screen 101, by further manipulation of the horizontal control 77 and of the vertical control 78 as needed. All portions of the cursor 69 are thereafter aligned to the fiducial mark 61 as shown in FIG. 9 to equalize the gap 116 between the cursor 69 and the adjacent edges 58. After such alignment of the cursor 69 to the fiducial mark 61, the position of the cursor 69 becomes an electronically generated reference to compare printed fiducial marks on substrates such as the substrate 106.

The printer 35 is now operated to print a desired pattern including the described fiducial mark 61 on the substrate 106. The printed substrate 106 is substituted on the platform 83 of the table 72 for the standards substrate 41, and the position of the fiducial mark 61 of the printed substrate 106 is compared to the position of the cursor 69.

Figure 8:
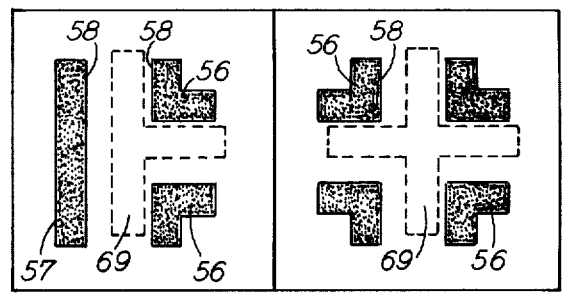
FIGS. 8 and 9 show a printed fiducial mark on a test substrate in respective order prior to and after an ideal alignment of the mask is achieved.

The linear deviation of the printed fiducial mark 61 from the position of the cursor 69 may now be visually estimated, or the horizontal and vertical controls 77 and 78 may be operated to read off on a typical micrometer scale 117 the magnitude of such deviation. A corresponding adjustment of the frame 108 in the printer 35 may now be made to bring the mask 107 into virtual alignment with the desired position relative to the first reference guide 87 in the printer 35. FIG. 8 shows a typical misalignment of the fiducial mark 61 relative to the cursor 69. To completely alleviate such a misalignment, the printing and adjustment procedure may have to be repeated. However, such a procedure is terminated when an ideal alignment of the fiducial mark 61 relative to the cursor 69 is reached, as shown in FIG. 9.

Figure 10:
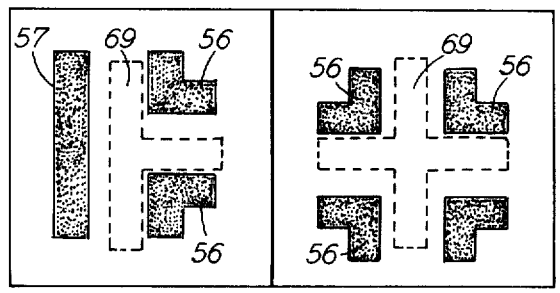
FIG. 10 shows a misorientation between the cursor and the fiducial mark on the substrate.

FIG. 10 illustrates a typical misalignment of the mask 107 with respect to the substrate 106 in which the orientation of the pattern on the substrate would be less than ideal. Such a misalignment may be corrected by rotating the mask 107 relative to the reference guide 87. When the alignment of the mask is clearly within tolerable limits in the horizontal, vertical and in the rotational directions, printing operations on a plurality of the substrates 106 may be performed.

Even though an initial alignment of the printed fiducial mark 61 to the cursor 69 may prove to be quite precise, it has been found advisable to monitor the printing of the substrates 106 at least intermittently. An abrasive action of the substrates, such as the substrate 106 causes wear on the discs 14, 16 and 17. The wear causes a gradual repositioning of the substrates 106 with respect to the mask 107. Since the wear may not be equal in all of the printers 35 which may be involved in a pattern generation process, various levels of the pattern are likely to shift with respect to each other. Also, forcing the ink through the mask 107 subjects the mask 107 to stress particularly in the direction in which the blade 111 moves the ink. FIG. 11 depicts a typical printed fiducial mark 61 which indicates that the corresponding mask 107 has stretched as a result of the stress. Any deviation which causes the resulting runout of the printed markers 56 to contact adjacent portions of the cursor 69 would render the printed pattern on such substrate 106 unacceptable.

It has been found that the life of the mask 107 can be prolonged by a periodic adjustment in the horizontal direction to distribute any error which may appear as shown in FIG. 11 between both sides of the fiducial mark 61 relative to the cursor. Such an equalizing adjustment theoretically aligns the center of the pattern to its desired position and distributes a small but opposite error in the pattern to both ends of the substrate 106.

The invention has been described with reference to a specific embodiment. From the above description various changes and modifications may come to mind which should be considered within the spirit and scope of this invention.

What is claimed is:

1. A method of adjusting a printing mask mounted in a visually inaccessible location of a printing apparatus relative to a first substrate holder having a first reference guide oriented in the direction of a reference axis of said first substrate holder, such that a pattern on the printing mask, including alignment marks, becomes located coincident with a predetermined position on a substrate when such substrate is placed against said first reference guide on said first substrate holder, the method comprising:

positioning a standard having at least one reference edge and having alignment features thereon located at predetermined distances from said at least one reference edge on a second substrate holder and with said at least one reference edge of said standard against a second guide located on said second substrate holder and oriented in the direction of a second reference axis, said alignment features including at least one set of fiducial marks which corresponds to the predetermined position of the alignment marks on the substrate;

manipulating the second substrate holder relative to two spaced fields of view of a viewing screen of an imaging system to directionally align the second reference axis with a centerline through said spaced fields of view;

generating cursor marks on said viewing screen, said cursor marks corresponding to the alignment marks of the pattern on said printing mask;

translating the second substrate holder with said standard thereon relative to the fields of view of said screen and said cursor marks on said screen to align the cursor marks and said at least one set of fiducial marks to each other;

placing a substrate against said first reference guide in said printing apparatus;

printing the pattern including the alignment marks of the printing mask onto the substrate;

positioning the substrate with the printed pattern in place of the standard on the second substrate holder;

comparing the position of an image of the printed alignment marks to the position of the cursor marks to determine a deviation of the printed alignment marks from the predetermined position on the substrate; and adjusting the position of the mask to correct any such deviation.

2. A method of adjusting a printing mask according to claim 1, wherein said at least one set of fiducial marks includes a plurality of sets of fiducial marks, and a plurality of masks carry distinct patterns and each pattern includes alignment marks each in a position corresponding to a designated position of a fiducial mark on the standard with respect to said at least one reference edge, and wherein, prior to printing a plurality of such distinct patterns onto a substrate in such predetermined position, each mask carrying such respective pattern is adjusted by repeating the steps of translating, placing, printing, positioning, comparing and adjusting for each of such masks, whereby each of such distinct patterns on such printed substrate are aligned with respect to each other solely through a correspondence of its respective alignment marks with the cursor marks on the viewing screen.

3. A method of adjusting a printing mask in accordance with claim 1, wherein manipulating the second substrate holder comprises:

translating the position of the second substrate holder relative to the fields of view of the viewing screen, the viewing screen being a split image screen, to project onto each portion of said screen a horizontal line marker from each of the fields of view; and rotating the second substrate holder with respect to the fields of view of the screen to bring such horizontal line markers into collinear relationship with each other.

* * * * *